(12) United States Patent
Lee et al.

(10) Patent No.: US 11,776,943 B2
(45) Date of Patent: Oct. 3, 2023

(54) DISPLAY PANEL AND MANUFACTURING METHOD FOR SAME

(71) Applicant: Samsung Display Co., Ltd., Yongin-si (KR)

(72) Inventors: Hyun A Lee, Seoul (KR); Sunok Oh, Hwaseong-si (KR); Kikyung Youk, Bucheon-si (KR); Chan-Jae Park, Suwon-si (KR); Sangduk Lee, Yongin-si (KR); Soo Yeon Han, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 8 days.

(21) Appl. No.: 17/365,678

(22) Filed: Jul. 1, 2021

(65) Prior Publication Data

US 2022/0013517 A1    Jan. 13, 2022

(30) Foreign Application Priority Data

Jul. 7, 2020    (KR) .......................... 10-2020-0083398

(51) Int. Cl.
*H01L 25/18* (2023.01)
*H01L 23/00* (2006.01)
(Continued)

(52) U.S. Cl.
CPC .............. *H01L 25/18* (2013.01); *H01L 24/06* (2013.01); *H01L 24/32* (2013.01); *H01L 24/83* (2013.01); *H01L 24/92* (2013.01); *H10K 50/844* (2023.02); *H10K 77/111* (2023.02); *H01L 24/16* (2013.01); *H01L 24/33* (2013.01); *H01L 24/73* (2013.01); *H01L 24/81* (2013.01); *H01L 2224/0603* (2013.01); *H01L 2224/06132* (2013.01); *H01L 2224/06135* (2013.01);
(Continued)

(58) Field of Classification Search
None
See application file for complete search history.

(56) References Cited

U.S. PATENT DOCUMENTS 7,109,575 B2    9/2006  Kang et al.
2018/0114768 A1    4/2018  Song et al.
(Continued)

FOREIGN PATENT DOCUMENTS

JP    2010135513    6/2010
KR    10-0699823    3/2007
KR    10-2018-0043872    5/2018

OTHER PUBLICATIONS

European Search Report dated Dec. 9, 2021 in EP Appl. No. 21176771.0.

*Primary Examiner* — Telly D Green
(74) *Attorney, Agent, or Firm* — H.C. Park & Associates, PLC

(57) ABSTRACT

A display panel having a display region and a non-display region, the display panel includes: a substrate having at least one first opening; an electronic component disposed on the substrate; a plurality of pads disposed in the non-display region and including a first pad and a second pad are spaced apart from each other in a first direction with the at least one first opening therebetween; and an adhesive layer disposed between the substrate and the electronic component and overlapping the at least one first opening.

18 Claims, 12 Drawing Sheets

(51) Int. Cl.
  *H10K 77/10*     (2023.01)
  *H10K 50/844*    (2023.01)
  *H10K 59/131*    (2023.01)

(52) U.S. Cl.
  CPC ............ *H01L 2224/16145* (2013.01); *H01L 2224/32112* (2013.01); *H01L 2224/32145* (2013.01); *H01L 2224/32225* (2013.01); *H01L 2224/73204* (2013.01); *H01L 2224/81205* (2013.01); *H01L 2224/83205* (2013.01); *H01L 2224/83908* (2013.01); *H01L 2224/9211* (2013.01); *H10K 59/131* (2023.02)

(56) References Cited

U.S. PATENT DOCUMENTS

| | | | |
|---|---|---|---|
| 2018/0120987 A1* | 5/2018 | Kim | ................... G06F 3/0446 |
| 2018/0122889 A1 | 5/2018 | Kim et al. | |
| 2019/0196636 A1 | 6/2019 | Kim et al. | |
| 2019/0326367 A1* | 10/2019 | Jung | ....................... G06V 40/13 |
| 2020/0133407 A1* | 4/2020 | Kim | ....................... G06F 1/1684 |
| 2020/0161582 A1* | 5/2020 | Choi | ................... H01L 51/5253 |
| 2020/0201392 A1* | 6/2020 | Yu | ........................ H01L 27/322 |

\* cited by examiner

DISPLAY PANEL AND MANUFACTURING METHOD FOR SAME

CROSS-REFERENCE TO RELATED APPLICATION

This application claims priority from and the benefit of Korean Patent Application No. 10-2020-0083398, filed on Jul. 7, 2020, which is hereby incorporated by reference for all purposes as if fully set forth herein.

BACKGROUND

Field

Exemplary implementations of the invention relate generally to a display panel and a manufacturing method for the same, and, more particularly, to a display panel including an adhesive layer exposed through an opening of a substrate and a manufacturing method for the same.

Discussion of the Background

Electronic devices, such as display devices, include a plurality of circuit lines and a plurality of electronic elements connected to the circuit lines and operate by receiving electrical signals. An adhesive member is used to connect the plurality of circuit lines and electronic elements. For example, a non-conductive film (NCF) has been used as an adhesive member for connecting pads and electronic component of a display panel included in a display device.

The nonconductive film is cured by heat and a step of measuring the curing rate of the nonconductive film used as the adhesive member is necessary during manufacturing display panel.

The above information disclosed in this Background section is only for understanding of the background of the inventive concepts, and, therefore, it may contain information that does not constitute prior art.

SUMMARY

Applicant realized that measuring the curing rate of the nonconductive film used as the adhesive member, can damage electronic components of the display panel.

Display panels constructed according to the principles and exemplary implementations of the invention and methods for manufacturing the same are capable of readily measuring the curing rate of an adhesive member without damaging the display panel. For example, the display panel may include a substrate having an opening and an adhesive layer exposed through the opening. The curing rate may be measured by a probe or the like inserted through the opening of the adhesive layer.

Additional features of the inventive concepts will be set forth in the description which follows, and in part will be apparent from the description, or may be learned by practice of the inventive concepts.

According to one aspect of the invention, a display panel having a display region and a non-display region, the display panel includes: a substrate having at least one first opening; an electronic component disposed on the substrate; a plurality of pads disposed in the non-display region and including a first pad and a second pad spaced apart from each other in a first direction with the at least one first opening disposed therebetween; and an adhesive layer disposed between the substrate and the electronic component.

The adhesive layer may have a first surface exposed through the at least one first opening.

The substrate may include a bendable part and a non-bendable part disposed in the non-display region. The opening may overlap the display region in a position in which the non-bendable part and the display region may overlap each other.

The display panel may further include a first bump electrically connected with the first pad and a second bump electrically connected with the second pad. The first bump and the second bump may be disposed between the electronic component and the substrate without overlapping the at least one first opening.

The at least one first opening may have a generally circular shape with an average diameter being about equal to or greater than 10 μm and equal to or less than about 1,000 μm.

The at least one first opening may include a plurality of openings spaced apart from each other.

The at least one first opening may include a single opening having a generally rectangular shape defined by two sets of generally parallel sides.

The display panel may further include an insulating layer directly disposed on the substrate and having a second opening overlapping the at least one first opening.

The second opening may contain material from the adhesive layer.

The first pad may be closer to the display region than the second pad.

The at least one first opening may be closer to the first pad than to the second pad.

A first distance between the first pad and the at least one first opening may be substantially parallel to the first direction, and the first distance may be about equal to or greater than 10 μm and equal to or less than about 100 μm.

A second distance between the second pad and the at least one first opening may be substantially parallel to the first direction, and the second distance may be equal to or greater than about 300 μm and equal to or less than about 700 μm.

The at least one first opening may include a first region containing material from the adhesive layer and a second region spaced apart from the adhesive layer with the first region therebetween.

The at least one first opening may have a width in a direction substantially perpendicular to the thickness direction of the display panel, the width being equal to or greater than about 10 μm and equal to or less than about 1,000 μm.

The display panel may further include a protective film disposed on a first surface of the substrate. The protective film may include a first opening region overlapping the electronic component.

The first opening region of the protective film may overlap the at least one first opening.

The first bump may overlap and contact the first pad and the second bump may overlap and contact the second pad.

According to another aspect of the invention, a method for manufacturing a display panel, the method includes the steps of: providing a substrate having at least one opening, and a plurality of first pads and second pads spaced apart from the first pads in a first direction with the at least one opening therebetween are disposed; providing a preliminary adhesive layer on the substrate; providing an electronic component on the preliminary adhesive layer; forming an adhesive layer by applying an ultrasonic wave to the preliminary adhesive layer to attach the substrate and the electronic component; and measuring a curing rate of the adhesive layer through the opening.

The step of measuring the curing rate may be performed by measuring the curing rate of a first surface of the adhesive layer exposed through the opening.

The preliminary adhesive layer may be non-conductive and include a thermal initiator.

The at least one opening may be formed without overlapping the first pads and the second pads.

The method may further include the step of providing first and second bumps electrically connected to the first and second pads, respectively, the first and second bumps being disposed on the electronic component. The at least one opening may be disposed between the first bumps and the second bumps.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
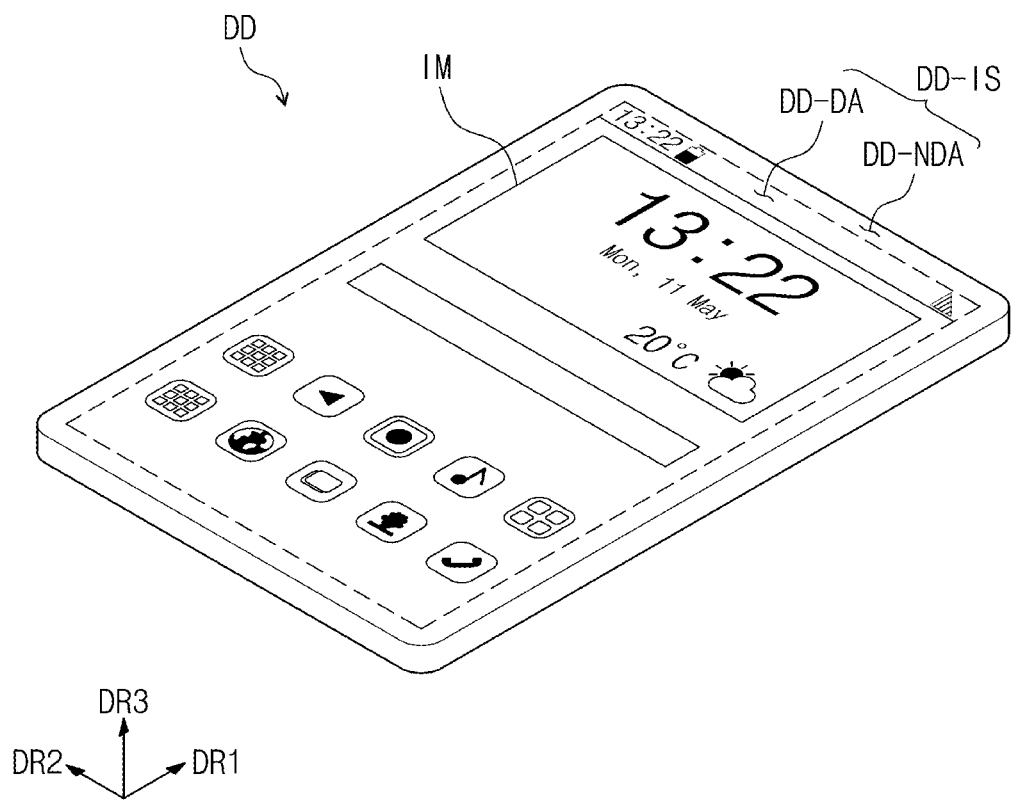
FIG. 1 is a perspective view of an embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an embodiment of a display device constructed according to the principles of the invention.

A display device DD may be a device activated in response to an electric signal. The display device DD may include various embodiments. For example, the display device DD may be constitute or be part of a personal computer, a laptop computer, a personal digital terminal, a car navigation unit, a smartphone, a tablet computer, a camera, or the like. These are only illustrated as embodiments, and other types of display devices may incorporate the inventive concepts disclosed herein. In the illustrated embodiment shown in FIG. 1, the display device DD may be used as a smartphone.

In FIG. 1 and the following figures, a first direction DR1 to a third direction DR3, and the directions indicated by the first to third direction axes DR1, DR2 and DR3 described in this specification are relative concepts and thus may be changed into different directions.

In this specification, for convenience of description, the third direction DR3 is defined as the direction in which an image is provided to a user. In addition, the first direction DR1 and the second direction DR2 are orthogonal to each other, and the third direction DR3 may be a normal line direction with respect to the plane defined by the first direction DR1 and the second direction DR2.

The display device DD may display an image IM through a display surface DD-IS. Referring to FIG. 1, the display surface DD-IS includes a display region DD-DA in which an image IM is displayed and a non-display region DD-NDA adjacent to the display region DD-DA. The non-display region DD-NDA is a region in which no image is displayed. However, an embodiments are not limited thereto, and the non-display region DD-NDA may be omitted.

Figure 2A:
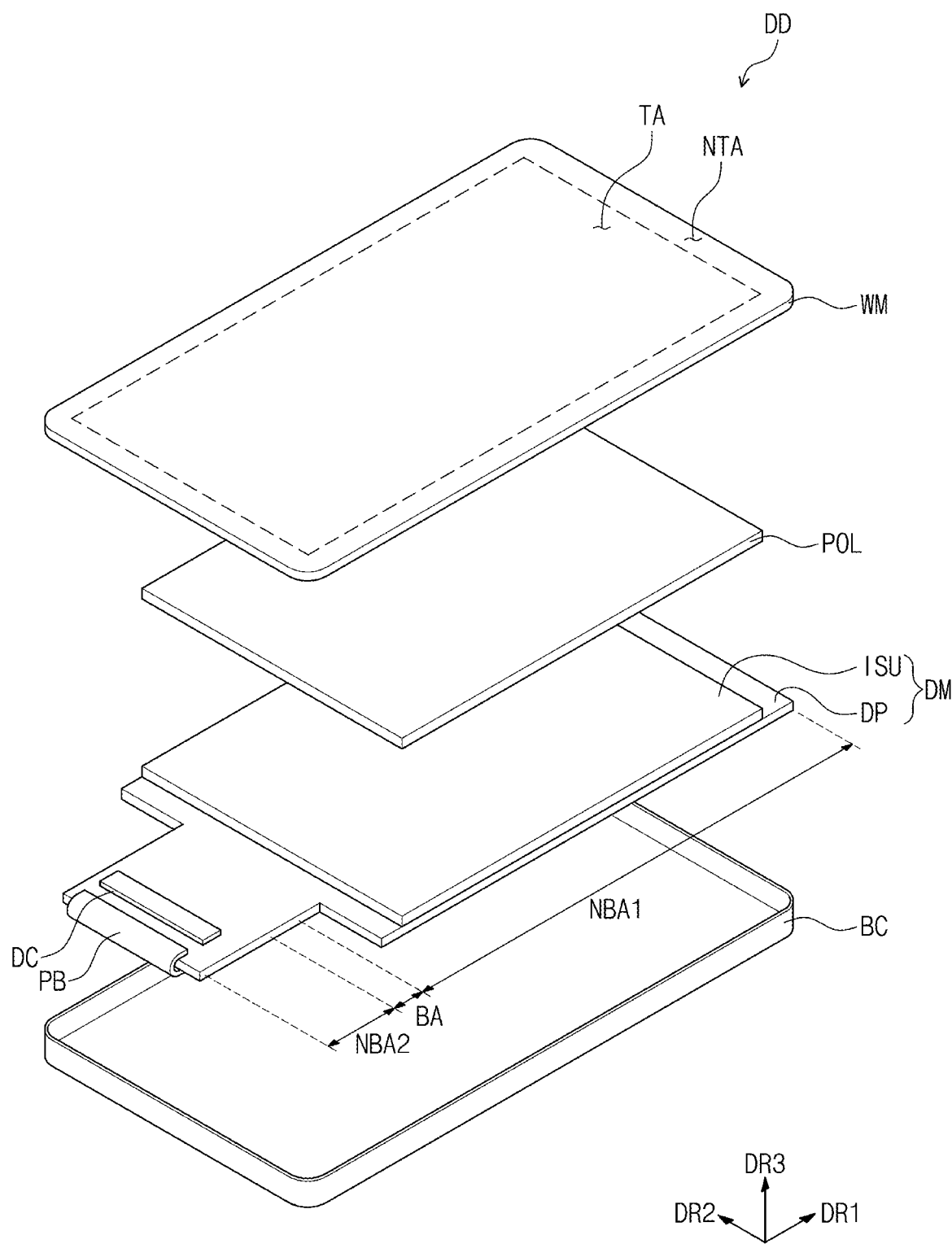
FIG. 2A is an exploded perspective view of the display device of FIG. 1 including a display panel in a substantially flat position.
Figure 2B:
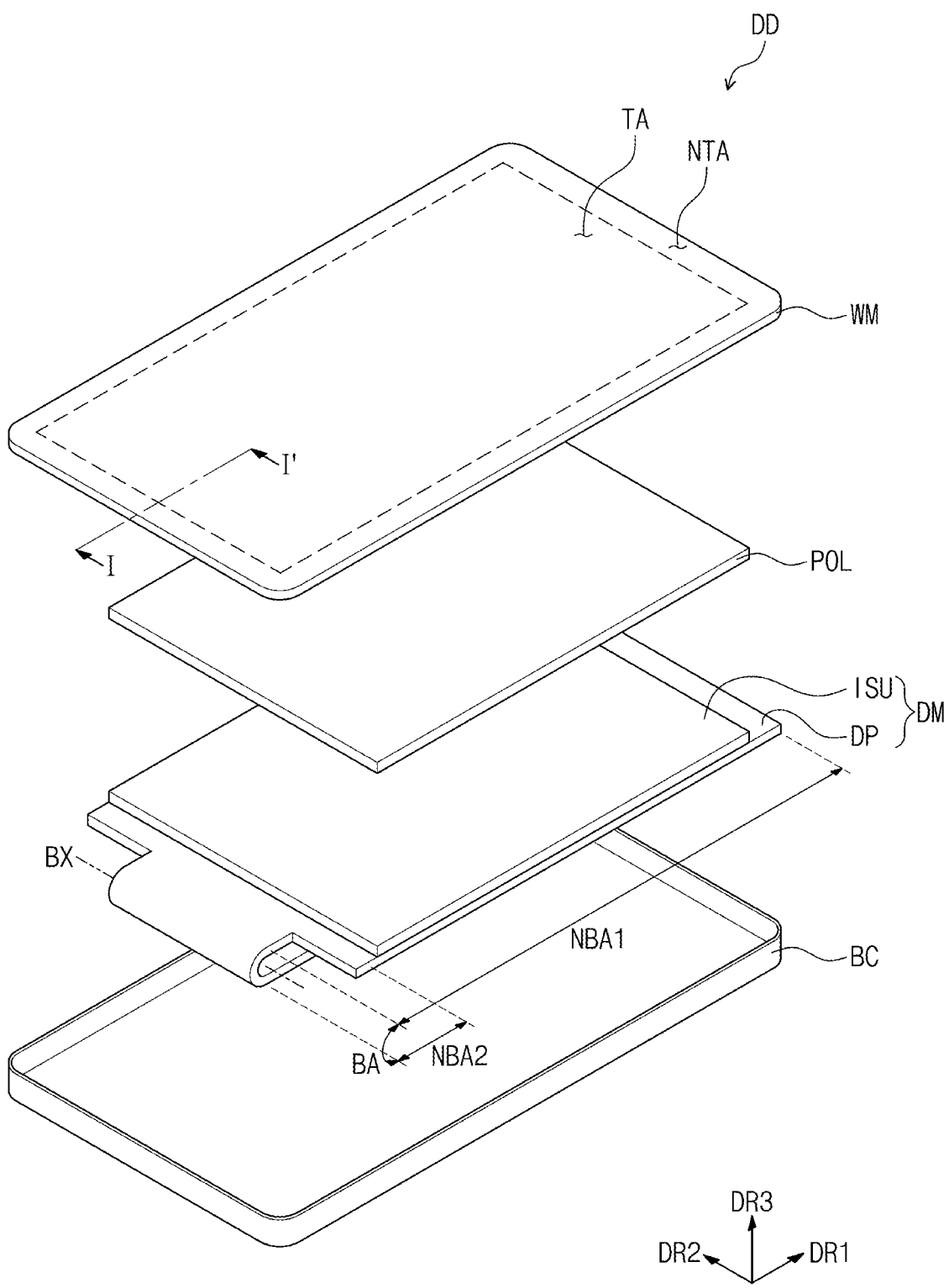
FIG. 2B is an exploded perspective view of the display device of FIG. 1 including a display panel in a bent position.
Figure 3:
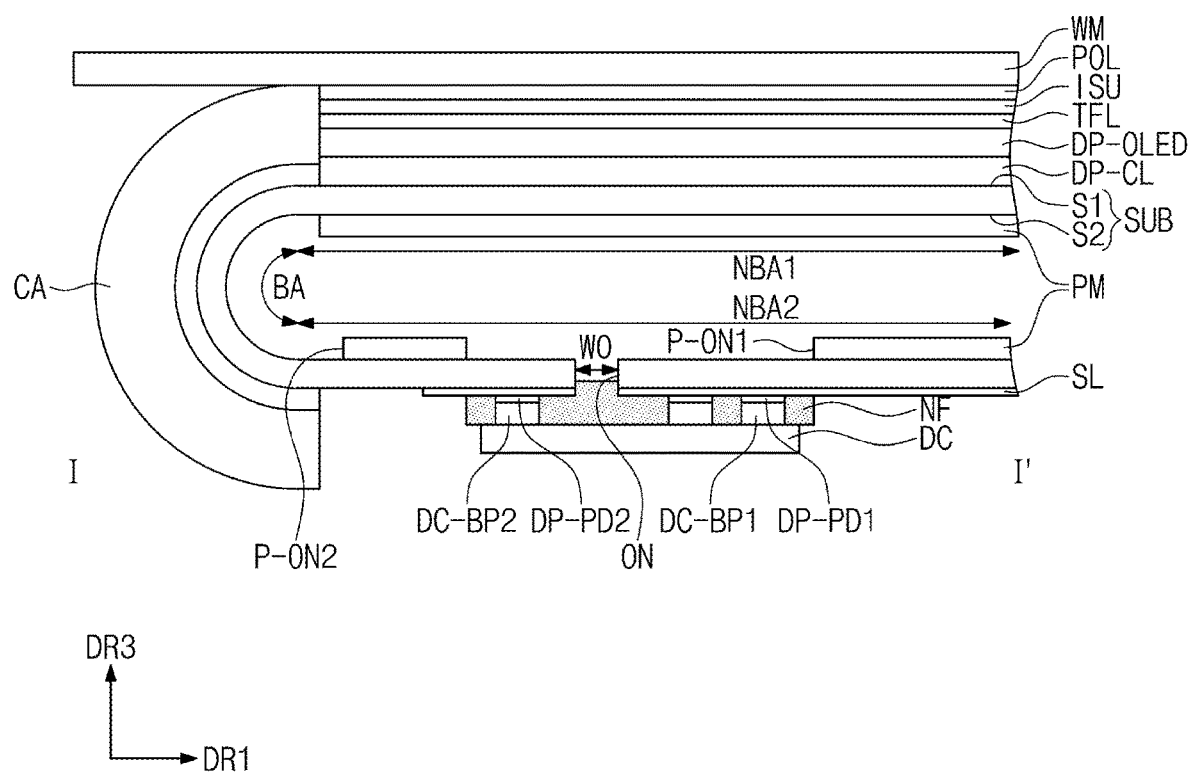
FIG. 3 is a cross-sectional view of the display device taken along line I-I' of FIG. 2B.
Figure 4A:
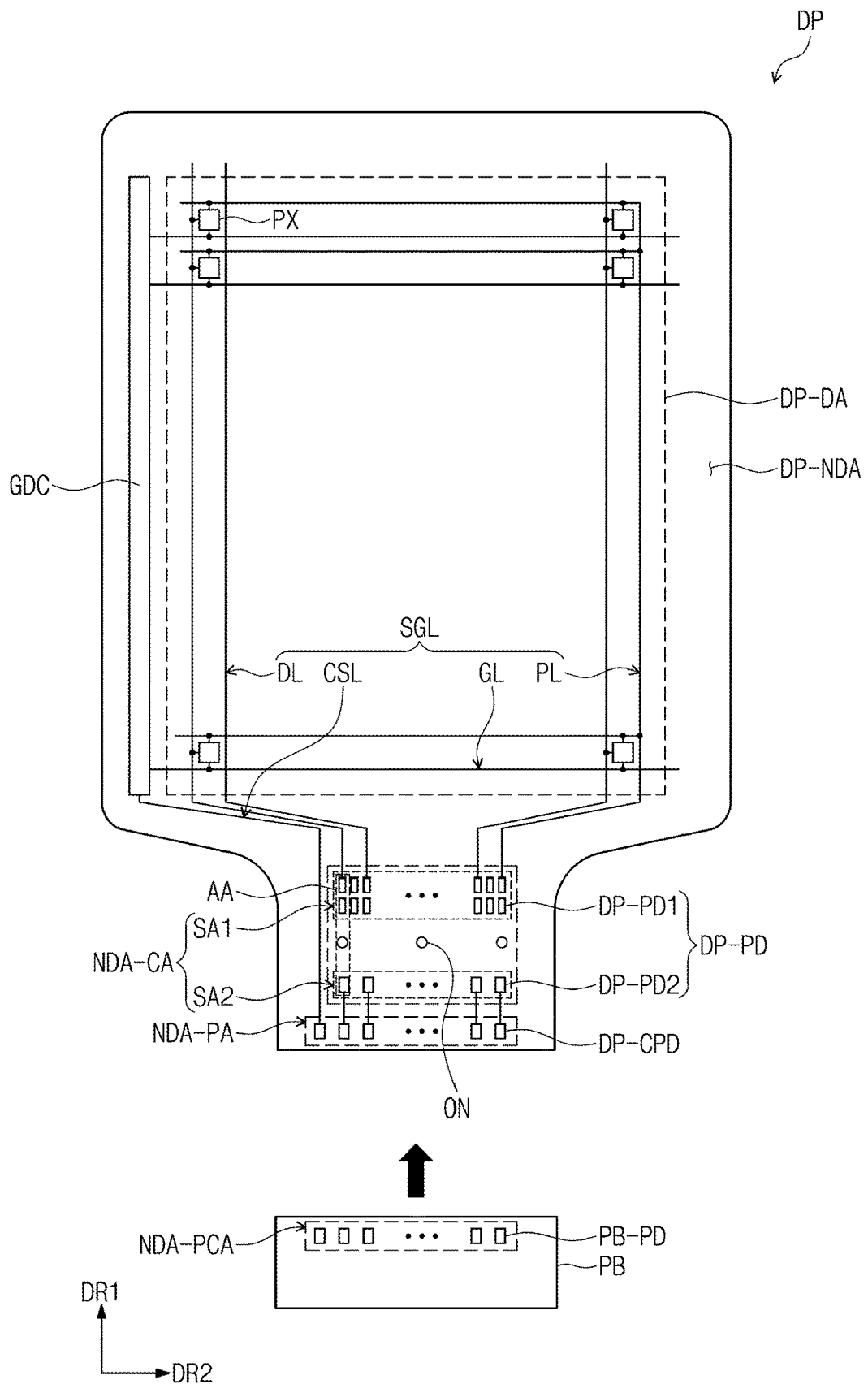
FIG. 4A is a plan view of an embodiment of the display panel constructed according to the principles of the invention.

FIG. 2A is an exploded perspective view of the display device of FIG. 1 including a display panel in a non-bent (substantially flat) position and FIG. 2B is an exploded perspective view of the display device of FIG. 1 including a display panel in a bent position. FIG. 3 is a cross-sectional view of the display device taken along line I-I' of FIG. 2B. FIG. 4A is a plan view of an embodiment of the display panel constructed according to the principles of the invention.

Referring to FIGS. 2A and 2B, the display device DD may include a window WM, an optical layer POL, a display module DM, and an accommodating member BC. The accommodating member BC may be a case, bracket, housing or the like to accommodate the display module DM and is coupled to the window WM. The optical layer POL may include, for example, a polarization layer or a color filter layer. However, embodiments are not limited thereto, and in the display device DD, the optical layer POL may be omitted.

The window WM may be disposed on the display module DM and transmit the image provided from the display module DM to the outside. The window WM includes a transmissive region TA and non-transmissive region NTA. The transmissive region TA may overlap the display region DD-DA and may have a shape corresponding to the display region DD-DA.

The image IM displayed on the display region DD-DA of the display device DD may be viewed from the outside through the transmissive region TA of the window WM. The non-transmissive region NTA may overlap the non-display region DD-NDA of the display device DD and have a shape corresponding to the non-display region DD-NDA of the display device DD. The non-transmissive region NTA may be a region having a relatively lower light transmittance than the transmissive region TA. However, embodiments are not limited thereto, and the non-transmissive region NTA may also be omitted.

The display module DM is disposed between the window WM and the accommodating member BC. The display module DM includes a display panel DP and an input sensing layer ISU.

The input sensing layer ISU may be disposed between the window WM and the display panel DP. The input sensing layer ISU detects an input applied from the outside. The input applied from the outside may be provided in various forms. For example, external inputs include various types of external inputs, such as a portion of user's body, a stylus pen, light, heat, or pressure.

Referring to FIGS. 2A, 2B and 3, the display panel DP may include a substrate SUB of FIG. 3, an electronic component DC disposed on the substrate SUB, and an adhesive layer NF of FIG. 3. In addition, the display panel DP may include a circuit board PB of FIG. 2A disposed on the substrate SUB. The substrate SUB may have an opening ON as shown in FIG. 3. The adhesive layer NF may couple the substrate SUB and the electronic component DC. The substrate SUB, the adhesive layer NF, the electronic component DC, and the circuit board PB will be described in more detail later.

Referring to FIGS. 2A and 2B, the display panel DP may generate an image, and transmit the generated image to the window WM. The display panel DP may include a first non-bendable (e.g., substantially flat) part NBA1, a second non-bendable part NBA2, and a bendable part BA. For example, referring to FIG. 4A, the first non-bendable part NBA1 may be disposed in a display region DP-DA of the display panel DP and in a non-display region DP-NDA of the display panel DP. The second non-bendable part NBA2 and the bendable part BA may be disposed in a non-display region DP-NDA of the display panel DP.

The bendable part BA may be disposed between the first non-bendable part NBA1 and the second non-bendable part NBA2. The first non-bendable part NBA1, the bendable part BA, and the second non-bendable part NBA2 may be disposed side by side in the first direction DR1. The width of each of the bendable part BA and the second non-bendable part NBA2 may be smaller than the maximum width of the first non-bendable part NBA1. The maximum width of the first non-bendable part NBA1, the width of the bendable part BA, and the width of the second non-bendable part NBA2 may be substantially parallel to the second direction DR2.

In FIG. 2B, a bent position of the display panel DP is shown unlike in FIG. 2A. In the bent position of the display panel DP, the second non-bendable part NBA2 of the display panel DP and the first non-bendable part NBA1 of the display panel DP may overlap. The bendable part BA may be bent about the bendable axis BX substantially parallel to the second direction DR2. The display panel DP may be accommodated in the accommodating member BC in a bendable position.

Referring to FIG. 3, a circuit layer DP-CL, a display element layer DP-OLED, and an encapsulation layer TFL may be sequentially stacked on the substrate SUB. The circuit layer DP-CL, the display element layer DP-OLED, and the encapsulation layer TFL may be stacked in the third direction DR3. An input sensing layer ISU may be disposed on the encapsulation layer TFL. The above-described optical layer POL and the window WM may be disposed on the input sensing layer ISU. The circuit layer DP-CL, the display element layer DP-OLED, and the encapsulation layer TFL may be disposed on the display region DP-DA of FIG. 4A of the display panel DP and disposed on the substrate SUB so as to overlap the display region DP-DA of the display panel DP. However, embodiments are not limited thereto, and the circuit layer DP-CL, and the encapsulation layer TFL may be disposed on the substrate SUB so as to overlap both the display region DP-DA and the non-display region DP-NDA of the display panel DP.

A coating layer CA may be disposed on the substrate SUB. The coating layer CA may be disposed on a first surface (e.g., an upper surface) S1 of the substrate SUB. With respect to the third direction DR3, the thickness of the coating layer CA may substantially be the same as the thickness from the substrate SUB to the optical layer POL. However, embodiments are not limited thereto, and the thickness of the coating layer CA may be different from the thickness from the substrate SUB to the optical layer POL. The coating layer CA may overlap the bendable part BA of the display panel DP. In addition, the coating layer CA may overlap the bendable part BA and partially overlap the first non-bendable part NBA1 or the second non-bendable part NBA2. The coating layer CA may cause the display panel DP to be easily bent and prevent damage to the display panel DP during bending of the display panel DP. For example, the coating layer CA may include an acrylic resin. However, this is exemplarily described, and materials included in the coating layer CA are not limited thereto.

A protective film PM may be disposed on a second surface S2 (e.g., a bottom surface) of the substrate SUB. The protective film PM may prevent a crack of the bendable part BA and facilitate the bending of the substrate SUB. The second surface S2 of the substrate SUB and the first surface S1 of the substrate SUB may be spaced apart from each other in the third direction DR3. The second surface S2 of the substrate SUB may face the first surface S1 of the substrate SUB on which the circuit layer DP-CL, the display element layer DP-OLED, and the encapsulation layer TFL are stacked.

The protective film PM may have a first opening region P-ON1 as shown in FIG. 3. The first opening region P-ON1 may overlap the electronic component DC. Referring to FIG. 3, when viewed in a cross-sectional view, the width of the first opening region P-ON1 may be greater than the width W0 of the opening ON. The width of the first opening region P-ON1 may be smaller than the width of the electronic component DC. In addition, the width of the first opening region P-ON1 may be greater than the width of the electronic component DC. Unlike this, the width of the first opening region P-ON1 and the width of the electronic component DC may substantially be the same. The width of the first opening region P-ON1 and the width of the electronic component DC may extend substantially parallel to the first direction DR1. In addition, the protective film PM may also have a second opening region P-ON2 formed as a sub opening region. Referring to FIG. 3, the second opening region P-ON2 may overlap the bendable part BA of the display panel DP. However, embodiments are not limited thereto, and the second opening region P-ON2 of the protective film PM may be omitted. The second opening region P-ON2 may be omitted and a pattern that facilitates the bending of the substrate SUB may be included.

The display element layer DP-OLED may include a plurality of organic light-emitting diodes. The display element layer DP-OLED may further include a pixel definition film etc. The encapsulation layer TFL seals the display element layer DP-OLED. The encapsulation layer TFL protects the display element layer DP-OLED from foreign substances such as water, oxygen, or dust particles.

The substrate SUB is a flexible substrate and may include a plastic substrate, a glass substrate, a metal substrate, an organic/inorganic composite material substrate, or the like. The circuit layer DP-CL may include at least one intermediate insulating layer and a circuit element. The intermediate insulating layer may include at least one intermediate inorganic film or at least one intermediate organic film.

The display panel DP may include a substrate SUB, an electronic component DC disposed on the substrate SUB, and an adhesive layer NF disposed between the substrate SUB and the electronic component DC. The electronic component DC and the adhesive layer NF may overlap the non-display region DP-NDA of FIG. 4A and be disposed on the substrate SUB. However, embodiments are not limited thereto, and the electronic component DC and the adhesive layer NF may overlap the display region DP-DA of FIG. 4A. The electronic component DC and the adhesive layer NF may overlap the non-display region DP-NDA and partially overlap the display region DP-DA.

The substrate SUB may have an opening ON as shown in FIG. 4A. Referring to FIG. 4A, the opening ON may be defined in the non-display region DP-NDA of the display panel DP. Referring to FIG. 3, the opening ON may be spaced apart from the circuit layer DP-CL, the display element layer DP-OLED, and the encapsulation layer TFL, which are stacked on the substrate SUB in the third direction DR3. The circuit layer DP-CL, the display element layer DP-OLED, and the encapsulation layer TFL may overlap the first non-bendable part NBA1, and the opening ON may be formed so as to overlap the second non-bendable part NBA2.

Referring to FIG. 3, the width W0 of the opening ON may be substantially parallel to the first direction DR1. The width W0 of the opening ON may extend perpendicular to the third direction DR3. That is, the width W0 of the opening ON may be perpendicular to the thickness direction of the display panel DP. According to an embodiment, when viewed in cross-section, the width W0 of the opening ON may be about 10-1,000 μm or less. For example, the width W0 of the opening ON may be about 10-100 μm or less. However, this is merely an example, and the range of the width W0 of the opening ON is not limited thereto. The width W0 of the opening ON may be a minimum width with which the curing rate of the adhesive layer NF can be measured.

The adhesive layer NF may be cured by heat. According to the curing rate of the adhesive layer NF, coupling power between the substrate SUB and the electronic component DC may vary. When the substrate and the electronic component are not appropriately coupled, problems may arise when driving the display panel. Accordingly, the reliability of the display panel and a display device including the display panel may be degraded.

In conventional arts, in order to measure the curing rate of the adhesive layer, the adhesive layer and the electronic component must be detached from the substrate and then the curing rate of the adhesive layer measured. Accordingly, damage to the display panel occurred when removing the electronic component and the adhesive layer, so that the method for measuring the curing rate of the adhesive layer was not easy to perform without negatively affecting performance or reliability.

However, in the display panel DP constructed according to the principles of the invention, the curing rate of the adhesive layer NF may be measured through the opening ON. Thus, in the display panel DP, the curing rate of the adhesive layer NF can be measured without removing the electronic component DC and the adhesive layer NF from the substrate SUB. Accordingly, damage to the display panel DP may be prevented and the method for measuring the curing rate may be simplified.

Referring to FIG. 4A, the display panel DP may include the display region DP-DA and the non-display region DP-NDA. The display region DP-DA of the display panel DP may correspond to the display region DD-DA of the display device DD shown in FIG. 1 or to the transmissive region TA of the window WM shown in FIGS. 2A and 2B. The non-display region DP-NDA of the display panel DP may correspond to the non-display region DD-NDA of the display device DD shown in FIG. 1 or to the non-transmissive region NTA of the window WM shown in FIGS. 2A and 2B.

The display panel DP may include a drive circuit GDC, a plurality of signal lines SGL, a plurality of pads DP-PD, a plurality of connection pads DP-CPD, and a plurality of pixels PX.

The pixels PX are disposed in the display region DP-DA of the display panel DP. The pixels PX each include an organic light-emitting diode and a pixel drive circuit connected thereto. The drive circuit GDC, the signal lines SGL, the pads DP-PD, the connection pads DP-CPD, and the pixel drive circuit may be included in the circuit layer DP-CL of FIG. 3.

The drive circuit GDC sequentially outputs gate signals to a plurality of gate lines GL. The drive circuit GDC may further output another different control signal to the pixels PX. The drive circuit GDC may include a plurality of thin film transistors which are formed through the same process as the pixel drive circuit of the pixels PX, for example, a low temperature polycrystalline silicon (LTPS) process or a low temperature polycrystalline oxide (LTPO) process.

The signal lines SGL include gate lines GL, data lines DL, a power line PL and a control signal line CSL. The gate lines GL are each connected to the corresponding pixel among the pixels PX, and the data lines DL are each connected to the corresponding pixel among the pixels PX. The power line PL is connected to the pixels PX. The control signal lines CSL may provide a scan drive circuit with control signals. The signal lines SGL may overlap the display region DP-DA and the non-display region DP-NDA.

Referring to FIG. 4A, the non-display region DP-NDA may include a chip region NDA-CA and a connection pad region NDA-PA. The pads DP-PD may be disposed in the chip region NDA-CA, and the connection pads DP-CPD may be disposed in the connection pad region NDA-PA. The chip region NDA-CA may be a region in which the electronic component DC shown in FIGS. 2A and 2B is mounted. The connection pad region NDA-PA may be a region in which a portion of the circuit board PB shown in FIGS. 2A and 2B is mounted. In this specification, the electronic component DC may be a drive chip.

The chip region NDA-CA includes a first pad region SA1 and a second pad region SA2 which are spaced apart from each other in the first direction DR1. The pads DP-PD include first pads DP-PD1 overlapping the first pad region SA1 and second pads DP-PD2 overlapping the second pad region SA2. The first pads DP-PD1 may be closer to the display region DP-DA than the second pads DP-PD2. The first pads DP-PD1 and the second pads DP-PD2 may be spaced apart from each other in one direction. The first pads DP-PD1 and the second pads DP-PD2 may be spaced apart from each other in the first direction DR1. The first pads DP-PD1 and the second pads DP-PD2 may be spaced apart from each other in one direction with the opening ON to be described later disposed therebetween.

Figure 5A:
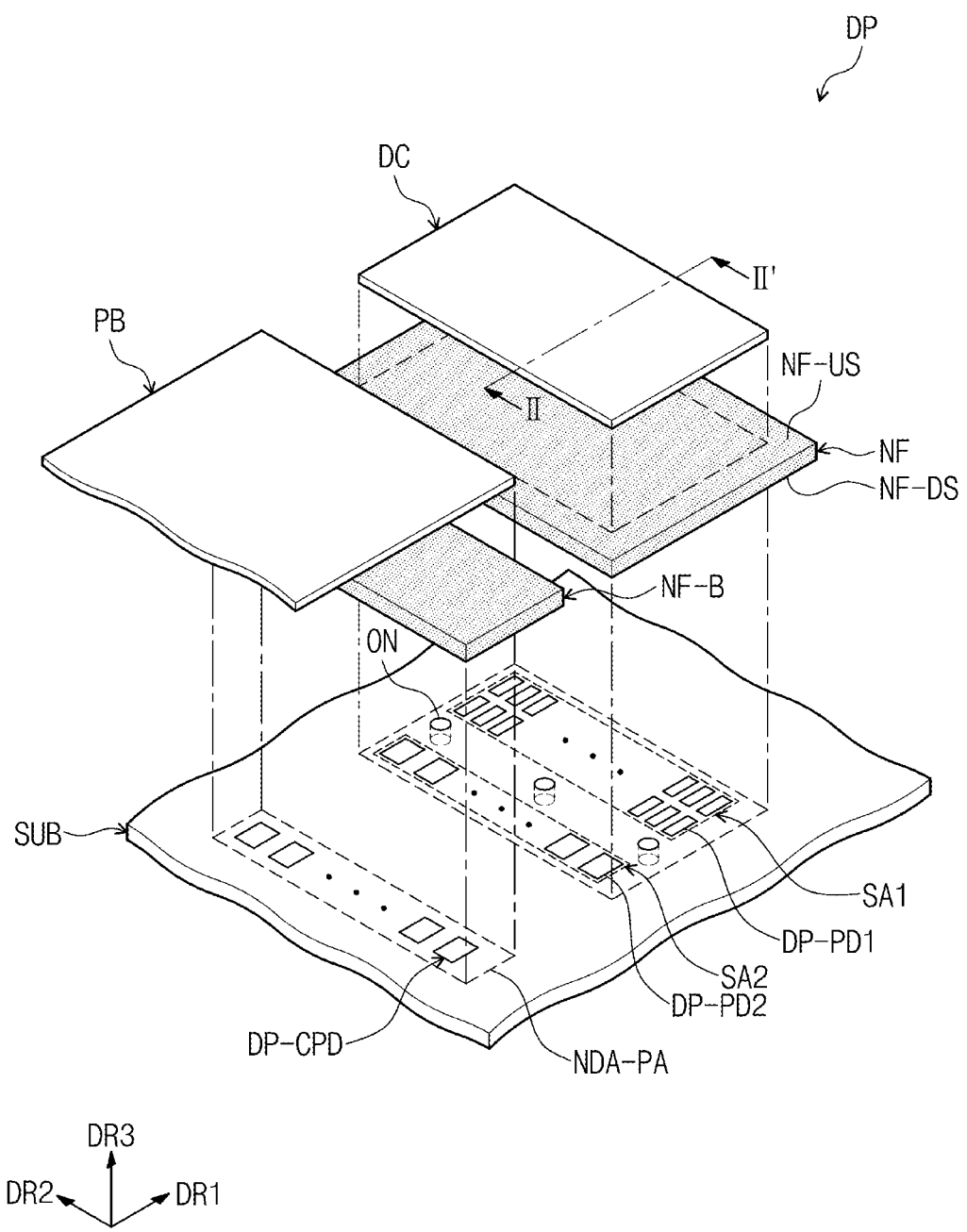
FIG. 5A is an exploded perspective view of an embodiment of a portion of the display panel of FIG. 4A.
Figure 5B:
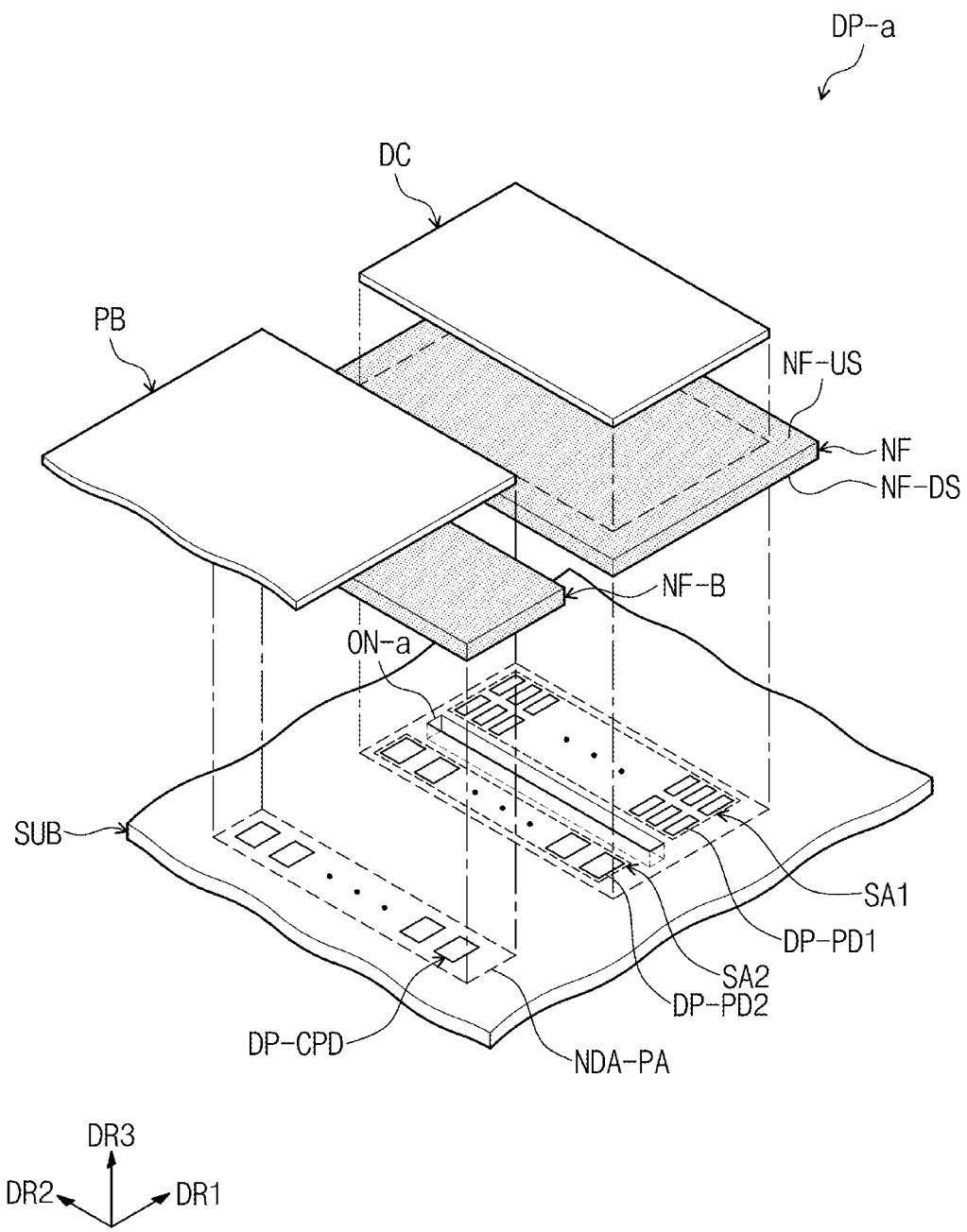
FIG. 5B is an exploded perspective view of another embodiment of a portion of the display panel of FIG. 4A.

As shown in FIG. 4A, the first pads DP-PD1 may be disposed in two rows. The two rows may each be substantially parallel to the second direction DR2. The first pads DP-PD1 may be disposed in one row of the two rows extending substantially parallel to the second direction DR2. The second pads DP-PD2 may each be disposed substantially parallel to the second direction DR2. The first pads DP-PD1 may correspond to the output pads electrically connected to the respective signal lines SGL. The second pads DP-PD2 may correspond to the input pads electrically connected to the respective connection pads DP-CPD. However, this is merely an example, and the number of the first pads DP-PD1 corresponding to the output pads and the number of the second pads DP-PD2 corresponding to the input pads are not limited thereto. In addition, as illustrated in FIGS. 4A, 5A and 5B, the configuration of the first pads DP-PD1 and the configuration of the second pads DP-PD2 may be different from each other. For example, the first pads DP-PD1 may be disposed in a single row or three or more rows.

The connection pads DP-CPD may be disposed substantially parallel to the second direction DR2 and be disposed on the substrate SUB so as to overlap the connection pad region NDA-PA. Some pads of the connection pads DP-CPD may be electrically connected to the second pads DP-PD2 disposed in the second pad region SA2, and the remaining pads may be electrically connected to the signal lines corresponding to the signal lines SGL. For example, any one connection pad among the connection pads DP-CPD may be connected to the control signal line CSL.

The circuit board PB includes circuit pads PB-PD that come into electrical contact with the connection pads DP-CPD. The circuit pads PB-PD may be disposed in a circuit pad region NDA-PCA defined in the circuit board PB.

Figure 4B:
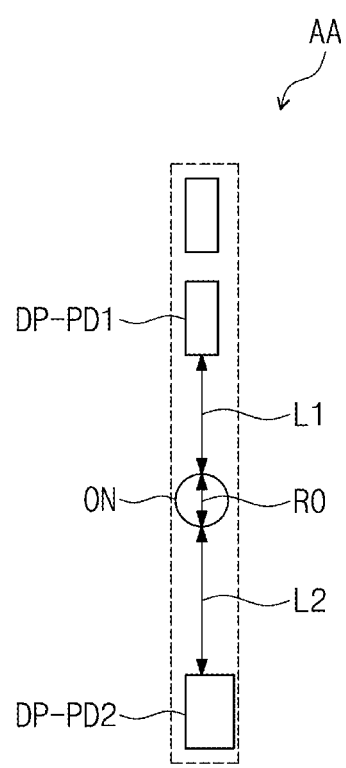
FIG. 4B is an enlarged plan view of a portion corresponding to region AA of FIG. 4A.

FIG. 4B is an enlarged plan view of a portion corresponding to region AA of FIG. 4A.

Referring to FIG. 4B, for example, the opening ON may be disposed between the first pad DP-PD1 and the second pad DP-PD2. As used herein, the first pad is any one pad of the first pads DP-PD1 and the second pad is any one pad of the above-mentioned second pads DP-PD2. Hereinafter, the first pad will be described by being referred to as the first pads DP-PD1 and the second pad will be described by being referred to as the second pads DP-PD2. The opening ON may not overlap the pads DP-PD. The opening ON may be defined in a region, in which pads DP-PD are not disposed, in the non-display region DP-NDA of the display panel DP. The opening ON may be disposed relatively close to the first pads DP-PD1 than to the second pads DP-PD2.

Referring to FIG. 4B, a first separation distance L1 between the opening ON and the first pads DP-PD1 may be smaller than a second separation distance L2 between the opening ON and the second pads DP-PD2. However, embodiments are not limited thereto, and the first separation distance L1 and the second separation distance L2 may be the same, or the first separation distance L1 may be greater than the second separation distance L2. The first separation distance L1 and the second separation distance L2 may each be substantially parallel to the first direction DR1. The first separation distance L1 may be the shortest distance between the opening ON and the first pads DP-PD1. The second separation distance L2 may be the shortest distance between the opening ON and the second pads DP-PD2.

The first separation distance L1 between the opening ON and the first pads DP-PD1 may be about 10-100 μm or less. For example, the first separation distance L1 may be about 10-20 μm or less. The second separation distance L2 between the opening ON and the second pads DP-PD2 may be about 300-700 μm or less. For example, the second separation distance L2 may be about 500-700 μm or less. However, this is merely an example, and the range of the separation distance L1 and L2 between the opening ON and the pads DP-PD is not limited thereto.

According to an embodiment, the opening ON may have a generally circular shape when viewed in plan. FIGS. 4A and 5A illustrate the opening ON in a circular shape. When the opening ON has a circular shape, the average diameter R0 (FIG. 4B) of the opening ON may be about 10-1,000 μm or less. For example, the average diameter R0 of the opening ON may be about 10-100 μm or less. However, this is merely an example, and the average diameter R0 of the opening ON is not limited thereto. When the opening ON has a circular shape, the average diameter R0 of the opening ON may be the same as the width W0 (FIG. 3) of the above-mentioned opening ON.

According to an embodiment, the opening ON may be provided in plural, and the plurality of openings ON may be spaced apart from each other when viewed in plan. Two or more openings ON may be provided, and the two or more openings ON may be spaced apart from each other when viewed in plan. FIGS. 4A and 5A illustrate that three circular openings ON are spaced apart a predetermined distance from each other, but the number of the openings ON is not limited thereto.

FIG. 5A is an exploded perspective view of an embodiment of a portion of the display panel of FIG. 4A and FIG. 5B is an exploded perspective view of another embodiment of a portion of the display panel of FIG. 4A.

For example, two or four openings ON may be provided. When the number of the openings is two, the central opening may be omitted from the three openings ON illustrated in FIGS. 4A and 5A. The plurality of openings may be spaced apart a predetermined distance from each other. When a plurality of openings is provided, the size and shape of each opening may be different from each other.

An opening ON-a may have a generally rectangular shape. FIG. 5B illustrate that unlike in FIGS. 4A and 5A, the opening ON-a has a rectangular shape including two long sides and two short sides. Referring to FIG. 5B, the two long sides may be substantially parallel to the direction (e.g., the second direction DR2) in which the plurality of first pads DP-PD1 are spaced apart from each other. In addition, the two long sides may be substantially parallel to the direction (e.g., the second direction DR2) in which the plurality of second pads DP-PD2 are spaced apart from each other. The two short sides may be substantially parallel to the direction in which the first pads DP-PD1 and the second pads DP-PD2 are spaced apart from each other. The two long sides may be substantially parallel to the second direction DR2, and the two short sides may be substantially parallel to the first direction DR1. The length of the two long sides may be smaller than the length of the long sides of the electronic component DC in the second direction DR2. The length of the two short sides may be smaller than the length of the short sides of the electronic component DC in the first direction DR1. However, this is exemplarily described, and the shape of the opening is not limited thereto.

Figure 6:
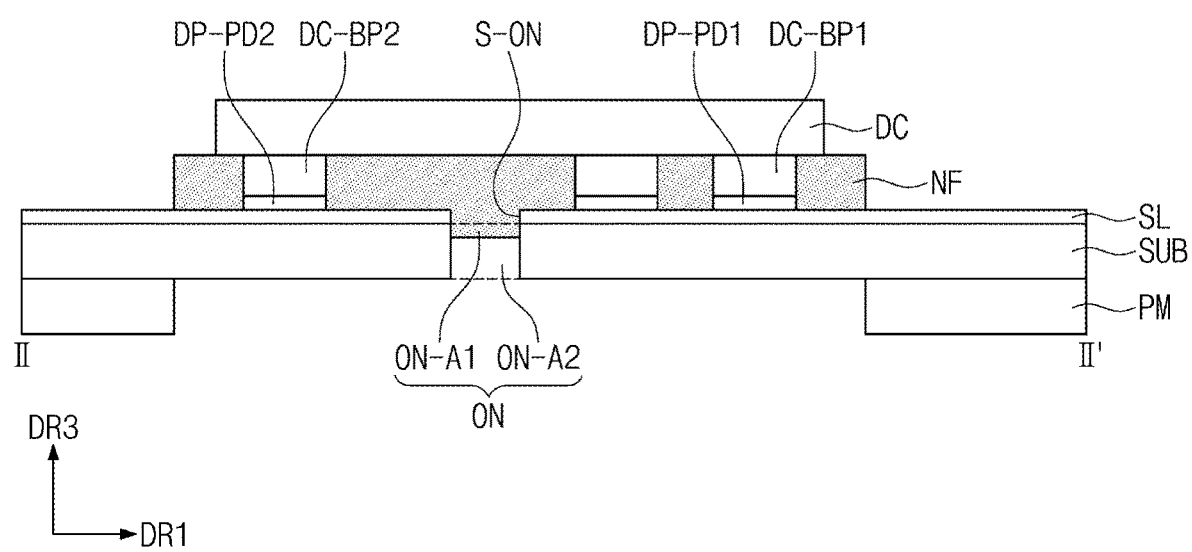
FIG. 6 is a cross-sectional view taken along line II-II' of FIG. 5A.

FIG. 6 is a cross-sectional view taken along line II-II' of FIG. 5A.

Referring to FIG. 6, an opening ON may include a first region ON-A1 and a second region ON-A2 arranged in a thickness direction (i.e., the third direction DR3). According to an embodiment, the first region ON-A1 may be adjacent to the adhesive layer NF. The first region ON-A1 may be filled with the same material as the adhesive layer NF. The second region ON-A2 may be spaced apart from the adhesive layer NF with the first region ON-A1 disposed therebetween. Unlike the first region ON-A1, the second region ON-A2 may not be filled with the same material as the adhesive layer NF. The second region ON-A2 may be a region which is not filled with a material but a vacant region.

Referring to FIGS. 3 and 6, bumps DC-BP1 and DC-BP2 may be disposed on the electronic component DC. The first bumps DC-BP1 corresponding to the first pads DP-PD1 and the second bumps DC-BP2 corresponding to the second pads DP-PD2 may be disposed on the electronic component DC. When the number of the first pads DP-PD1 is greater than the number of the second pads DP-PD2, the number of the first bumps DC-BP1 may be greater than the number of the second bumps DC-BP2.

The opening ON may be disposed between the first bumps DC-BP1 and the second bumps DC-BP2. The opening ON defined on the substrate SUB may be disposed between the first pads DP-PD1 and the second pads DP-PD2. In addition, the opening ON may be disposed between the first bumps DC-BP1 corresponding to the first pads DP-PD1 and the second bumps DC-BP2 corresponding to the second pads DP-PD2. The opening ON may not overlap the pads DP-PD and the bumps DC-BP1 and DC-BP2. The opening ON may be defined in a region in which pads are not present between the plurality of pads DP-PD.

Referring again to FIGS. 5A and 5B, the display panel DP and DP-a may include the substrate SUB, the electronic component DC disposed on the substrate SUB, and the adhesive layer NF disposed between the substrate SUB and the electronic component DC. The adhesive layer NF may couple the substrate SUB and the electronic component DC.

According to an embodiment, a lower surface NF-DS of the adhesive layer NF may be exposed through the opening ON. The adhesive layer NF may include the lower surface NF-DS and an upper surface NF-US spaced apart from the lower surface NF-DS. The lower surface NF-DS of the adhesive layer NF and the upper surface NF-US of the adhesive layer NF may be spaced apart from each other in the third direction DR3.

In the display panel DP in a non-bendable (e.g., substantially flat) position shown in FIG. 2A, the lower surface NF-DS of the adhesive layer NF may be relatively adjacent to the rear surface of the display device DD, and the upper surface NF-US of the adhesive layer NF may be relatively adjacent to the front surface of the display device DD. In addition, when the display panel DP is received in an accommodating member BC in a bendable position shown in FIG. 2B, the lower surface NF-DS of the adhesive layer NF may be relatively adjacent to the front surface of the display device DD, and the upper surface NF-US of the adhesive layer NF may be relatively adjacent to the rear surface of the display device DD. When the display panel DP is received in the accommodating member BC in the bendable position shown in FIG. 2B, the lower surface NF-DS of the adhesive layer NF may overlap the display surface DD-IS of the display device DD. The upper surface NF-US of the adhesive layer NF may be adjacent to the electronic component DC and the lower surface NF-DS of the adhesive layer NF may be adjacent to the substrate SUB. Thus, the lower surface NF-DS of the adhesive layer NF may be exposed through the opening ON of the substrate SUB.

In the display panel DP, the pads DP-PD and the bumps DC-BP1 and DC-BP2 may be thermally pressed to each other through an ultrasonic bonding method as is known in the art. The adhesive layer NF disposed between the substrate SUB and the electronic component DC may be thermally cured. Referring to FIG. 6, the thermally cured adhesive layer NF may surround the pads DP-PD1 and DP-PD2 and the bumps DC-BP1 and DC-BP2.

When the curing rate of the adhesive layer is smaller than the value required according to a manufacturing process, the substrate and the electronic component may not be appropriately coupled. The value required in the process may be a value required to normally drive the display panel. When the curing rate of the adhesive layer is smaller than the value required in the process, floating may be caused between the pads disposed on the substrate and the bumps disposed on the electronic component. When floating between the pads and bumps occurs, the pads and the bumps may not come into electrical contact. Accordingly, the reliability of the display panel may be degraded.

As described above, in the display panel DP of FIG. 5A and DP-a of FIG. 5B, the curing rate of the adhesive layer NF may be measured through the opening ON of the substrate SUB without detaching any electronic components. As the curing rate of the adhesive layer NF can be measured through the opening ON of the substrate SUB, floating between the pads DP-PD disposed on the substrate SUB and the bumps DC-BP1 and DC-BP2 disposed on the electronic component DC may be improved or eliminated. Accordingly, occurrence of defects in the display panel may be reduced or prevented, and the reliability of the display panel may be ensured.

Referring to FIGS. 3 and 6, an insulating layer SL may be disposed on the substrate SUB. The insulating layer SL may constitute a barrier layer and/or a buffer layer. FIGS. 3 and 6 illustrate the insulating layer SL as a single layer, but embodiments are not limited thereto. In another embodiment, an insulating layer SL may have multiple layers. The insulating layer SL may include a sub opening S-ON as shown in FIG. 6. The sub opening S-ON may overlap the opening ON of the substrate SUB. More specifically, the sub opening S-ON may overlap the first region ON-A1 of the opening ON. In the same manner as the first region ON-A1 of the opening ON, the sub opening S-ON may be adjacent to the adhesive layer NF. The sub opening S-ON may be filled with the same material as the adhesive layer NF.

Referring again to FIGS. 4A, 5A and 5B, a circuit board PB may be disposed on the display panel DP. The circuit board PB may be disposed on one end of the substrate SUB and electrically connected to the circuit layer DP-CL. The circuit board PB may be rigid or flexible. For example, when the circuit board PB is flexible, the circuit board PB may be provided as a flexible printed circuit board. The circuit board PB may include a timing control circuit for controlling the operation of the display panel DP. The timing control circuit may be mounted on the circuit board PB in the form of an integrated chip. The circuit board PB may include an input sensing circuit for controlling the input sensing layer ISU.

The circuit board PB may be coupled to the substrate SUB by a sub adhesive layer NF-B. The sub adhesive layer NF-B may exhibit the same characteristics as the adhesive layer NF. The sub adhesive layer NF-B may be formed of the same material as the adhesive layer NF.

The display panel DP of FIG. 5A and DP-a of FIG. 5B may include the substrate SUB in which the openings ON and ON-a is defined respectively, the electronic component DC disposed on the substrate SUB, and the adhesive layer NF disposed between the substrate SUB and the electronic component DC. The adhesive layer NF couples the substrate SUB and the electronic component DC, and the curing rate of the adhesive layer NF may be measured through the openings ON and ON-a of the substrate SUB, respectively. Accordingly, the damage to the display panel DP and DP-a may be reduced or prevented, and a method for measuring the curing rate of the adhesive layer NF is readily performed.

Figure 7:
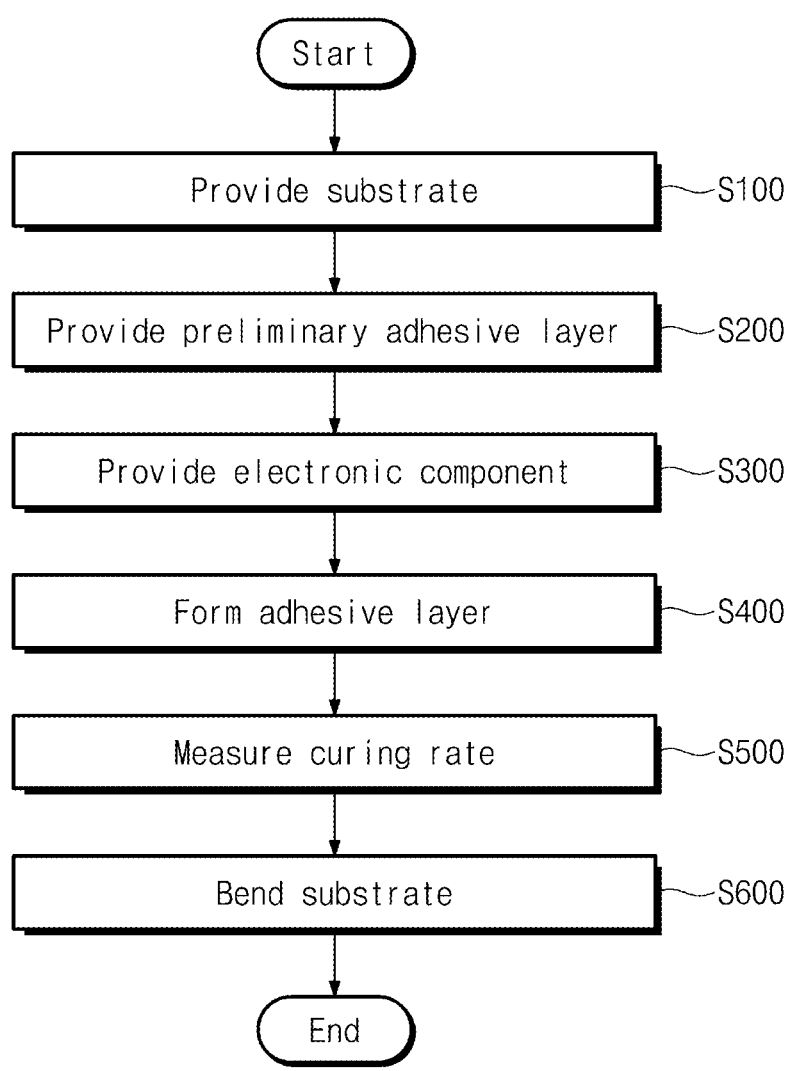
FIG. 7 is a flowchart of an embodiment of a display panel manufacturing method according to the principles of the invention.
Figure 8:
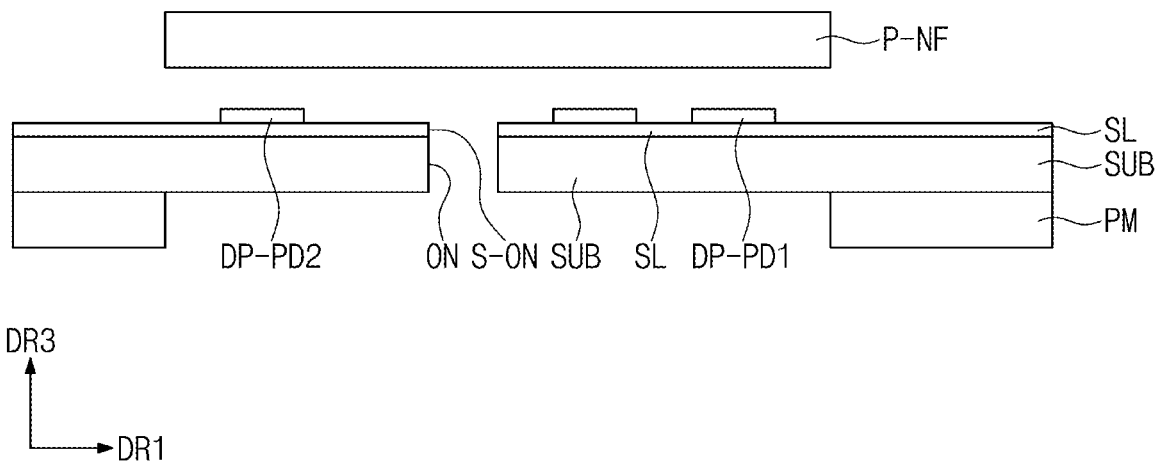
FIGS. 8 to 10 are cross-sectional views schematically illustrating specific steps of the exemplary display panel manufacturing method of FIG. 7.
Figure 9:
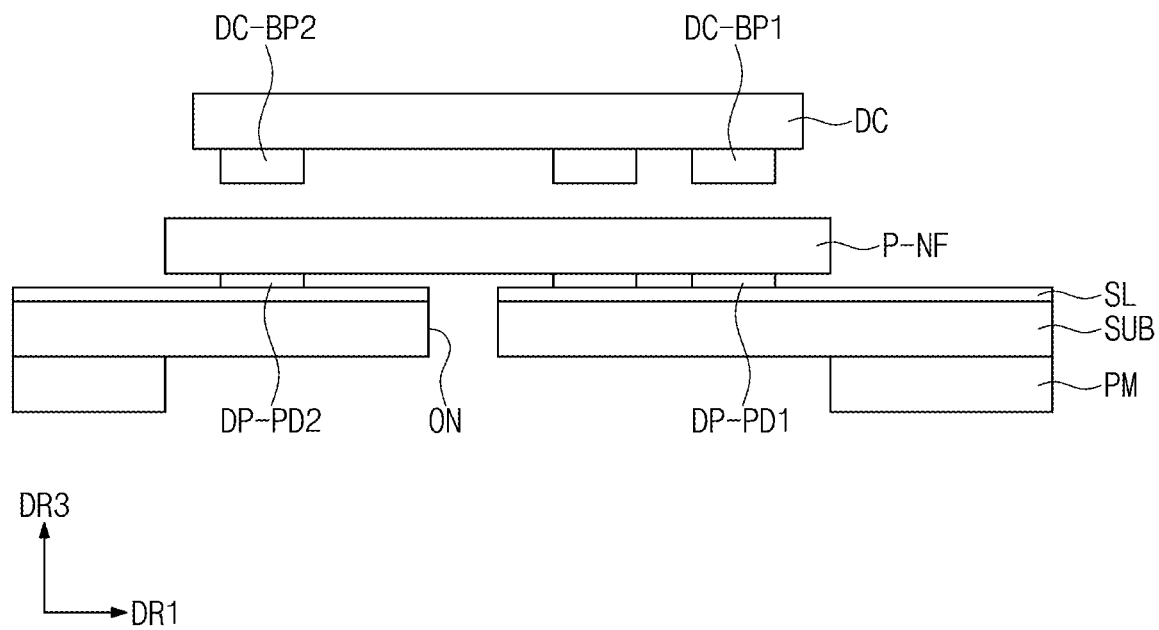
Figure 10:
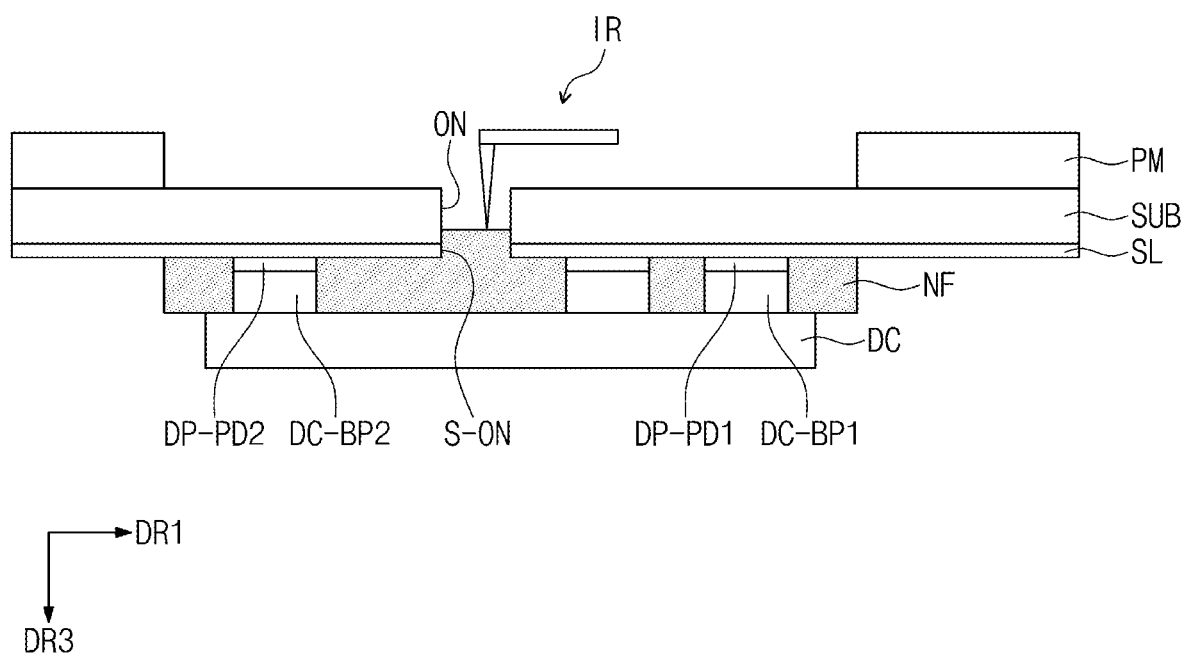

FIG. 7 is a flowchart of an embodiment of a display panel manufacturing method according to the principles of the invention. FIGS. 8 to 10 are cross-sectional views schematically illustrating specific steps of the exemplary display panel manufacturing method of FIG. 7. Components described with reference to FIGS. 2A to 6 will be described by the same reference symbols and detailed description thereon will be omitted.

Referring to FIG. 7, a display panel manufacturing method may include the steps of: providing a substrate SUB (S100), providing a preliminary adhesive layer P-NF (S200), providing an electronic component DC (S300), forming an adhesive layer NF (S400), and measuring a curing rate (S500). In addition, the display panel manufacturing method may further include the step of bending a substrate (S600) after the measuring of a curing rate (S500).

Referring to FIG. 8, in a display panel manufacturing method, the step of providing a substrate SUB (S100) may provide a substrate SUB which includes first pads DP-PD1 and second pads DP-PD2 and in which an opening ON is defined. An insulating layer SL may be disposed on the substrate SUB. In addition, the substrate SUB may be provided in a state in which a protective film PM is disposed under the substrate SUB.

For example, the substrate SUB may include a polyimide-based film. The substrate SUB may include any one among an acryl resin, a methacrylic resin, a polyisoprene resin, a vinyl resin, an epoxy resin, a urethane resin, a cellulose resin, a siloxane resin, a polyamide resin or a methylene resin. However, this is exemplarily described, and embodiments are not limited thereto.

The opening ON of the substrate SUB and the sub opening S-ON of the insulating layer SL may be formed by using laser. After the insulating layer SL is formed on the substrate SUB, the opening ON and the sub opening S-ON may together be formed. Alternatively, after the opening ON is formed on the substrate SUB by using laser, a mask may be provided on the opening ON. The mask is provided so that the insulating layer SL is disposed in a region excluding the opening ON of the substrate SUB, and the insulating layer SL may be formed through a deposition process. That is, the mask is provided so that the opening ON of the substrate SUB and the sub opening S-ON of the insulating layer SL may overlap. However, this is exemplarily described, and the method for forming the opening ON of the substrate SUB and the sub opening S-ON of the insulating layer SL is not limited thereto.

Next, referring to FIG. 9, a preliminary adhesive layer P-NF and an electronic component DC may be provided on the substrate SUB. The electronic component DC may be provided in a state in which first bumps DC-BP1 corresponding to first pads DP-PD1 and second bumps DC-BP2 corresponding to second pads DP-PD2 are disposed on the substrate SUB.

The preliminary adhesive layer P-NF may have a non-conductive property. The preliminary adhesive layer P-NF may be provided as an adhesive member in the form of a film including a thermal initiator. The adhesive layer NF for coupling the substrate SUB and the electronic component DC may be formed by applying ultrasonic wave to the preliminary adhesive layer P-NF.

As described above, the pads DP-PD disposed on the substrate SUB and the bumps DC-BP1 and DC-BP2 disposed on the electronic component DC may be thermally pressed to each other through an ultrasonic bonding method. The preliminary adhesive layer P-NF disposed between the substrate SUB and the electronic component DC may be thermally cured, so that the adhesive layer NF may be formed. The thermally cured adhesive layer NF may surround the pads DP-PD and the bumps DC-BP1 and DC-BP2.

Referring to FIG. 10, the curing rate of the adhesive layer NF may be measured through the opening ON of the substrate SUB. The cured adhesive layer NF may be partially exposed through the opening ON of the substrate SUB. More specifically, a lower surface NF-DS (FIG. 5A) of the cured adhesive layer NF may be partially exposed through the opening ON. In order to measure the curing rate of the adhesive layer NF, a Fourier transform infrared spectrometer (FT-IR) may be used. FIG. 10 illustrates a probe IR as tool for measuring the curing rate of the adhesive layer NF, but this is exemplarily illustrated, and the method for measuring the curing rate is not limited thereto.

For example, the curing rate may be analyzed by measuring the peaks of the functional groups included in the preliminary adhesive layer P-NF and the adhesive layer NF. The peaks of the functional groups may be measured by the Fourier transform infrared spectrometer. The peaks of the functional groups may be measured in the preliminary adhesive layer P-NF, and the peaks of the functional groups may be measured in the adhesive layer NF formed after applying ultrasonic wave. The curing rate may be measured by comparing the peaks measured in the preliminary adhesive layer P-NF and the peaks measured in the adhesive layer NF. Alternatively, the curing rate may be measured by comparing the area of a graph measured in the preliminary adhesive layer P-NF and the area of a graph measured in the adhesive layer NF.

The display panel DP may be bent after measuring the curing rate. More specifically, the substrate SUB included in the display panel DP may be bent. As illustrated in FIGS. 2B and 3, the substrate SUB included in the display panel DP may be bent. However, embodiments are not limited thereto, and the bendable of the substrate SUB may be omitted.

Accordingly, the method for manufacturing the display panel illustrated in FIGS. 7 to 10 may simplify a method for measuring the curing rate of the adhesive layer by including the measuring the curing rate of the adhesive layer through the opening. In addition, the curing rate of the adhesive layer may be measured without removing the adhesive layer and the electronic component from the substrate, and thus, damage to the display panel may be reduced or prevented.

Display panels constructed according to the principles and embodiments of the invention may include a substrate in which an opening is defined, an electronic component disposed on the substrate, and an adhesive layer which is disposed between the substrate and the electronic component. The opening do not overlap pads disposed on the substrate. The lower surface of the adhesive layer may be exposed through the opening of the substrate, and the curing rate of the adhesive layer may be measured through the lower surface of the adhesive layer exposed through the opening. The curing rate of the adhesive layer may be measured without removing the adhesive layer and the electronic component from the substrate. Accordingly, damage to the display panel may be reduced or prevented, and the curing rate of the adhesive layer may readily be measured.

Further, methods for manufacturing display panels according to the principles and embodiments of the invention may include the steps of: providing a substrate; providing a preliminary adhesive layer and an electronic component on the substrate; applying ultrasonic wave to the preliminary adhesive layer to form an adhesive layer; and measuring the curing rate of the adhesive layer through an opening. According to an embodiment, the method may further include the step of measuring the curing rate of the adhesive layer through the opening defined in the substrate. Accordingly, damage to the display panel may be reduced or prevented, and the curing rate of the adhesive layer may be simplified.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel having a display region and a non-display region, the display panel comprising:
   a substrate having at least one first opening;
   an electronic component disposed on the substrate;
   a plurality of pads disposed in the non-display region and including a first pad and a second pad spaced apart from each other in a first direction with the opening disposed therebetween without the plurality of pads overlapping the opening; and an adhesive layer disposed between the substrate and the electronic component.

2. The display panel of claim 1, wherein the adhesive layer has a first surface exposed through the at least one first opening.

3. The display panel of claim 1, wherein the substrate includes a bendable part and a non-bendable part disposed in the non-display region, wherein the opening overlaps the display region in a position in which the non-bendable part and the display region overlap each other.

4. The display panel of claim 1, further comprising a first bump electrically connected with the first pad and a second bump electrically connected with the second pad, wherein:

the first bump and the second bump are disposed between the electronic component and the substrate without overlapping the at least one first opening.

5. The display panel of claim 1, wherein the at least one first opening has a generally circular shape with an average diameter being equal to or greater than about 10 μm and equal to or less than about 1,000 μm.

6. The display panel of claim 1, wherein the at least one first opening comprises a plurality of openings spaced apart from each other.

7. The display panel of claim 1, wherein the at least one first opening comprises a single opening having a generally rectangular shape defined by two sets of generally parallel sides.

8. The display panel of claim 1, further comprising an insulating layer directly disposed on the substrate and having a second opening overlapping the at least one first opening.

9. The display panel of claim 8, wherein the second opening contains material from the adhesive layer.

10. The display panel of claim 1, wherein the first pad is closer to the display region than the second pad.

11. The display panel of claim 10, wherein the at least one first opening is closer to the first pad than to the second pad.

12. The display panel of claim 1, wherein:

a first distance between the first pad and the at least one first opening is substantially parallel to the first direction; and the first distance is equal to or greater than about 10 μm and equal to or less than about 100 μm.

13. The display panel of claim 1, wherein:

a second distance between the second pad and the at least one first opening is substantially parallel to the first direction; and the second distance is equal to or greater than about 300 μm and equal to or less than about 700 μm.

14. A display panel having a display region and a non-display region, the display panel comprising:

a substrate having at least one first opening;

an electronic component disposed on the substrate;

a plurality of pads disposed in the non-display region and including a first pad and a second pad spaced apart from each other in a first direction with the opening disposed therebetween; and an adhesive layer disposed between the substrate and the electronic component, wherein the at least one first opening comprises a first region containing material from the adhesive layer and a second region spaced apart from the adhesive layer with the first region therebetween.

15. The display panel of claim 1, wherein the at least one first opening has a width in a direction substantially perpendicular to the thickness direction of the display panel, the width being equal to or greater than about 10 μm and equal to or less than about 1,000 μm.

16. The display panel of claim 1, further comprising a protective film disposed on a first surface of the substrate, wherein the protective film includes a first opening region overlapping the electronic component.

17. The display panel of claim 16, wherein the first opening region of the protective film overlaps the at least one first opening.

18. The display panel of claim 4, wherein the first bump overlaps and contacts the first pad and the second bump overlaps and contacts the second pad.

* * * * *